(12) United States Patent
Lin et al.

(10) Patent No.: US 8,642,479 B2
(45) Date of Patent: Feb. 4, 2014

(54) METHOD FOR FORMING OPENINGS IN SEMICONDUCTOR DEVICE

(75) Inventors: Chih-Ching Lin, Taoyuan County (TW);
Yi-Nan Chen, Taoyuan County (TW);
Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 276 days.

(21) Appl. No.: 13/183,358

(22) Filed: Jul. 14, 2011

(65) Prior Publication Data

US 2013/0017687 A1    Jan. 17, 2013

(51) Int. Cl.
*H01L 21/302* (2006.01)

(52) U.S. Cl.
USPC ........... 438/710; 438/719; 438/723; 438/743; 438/757

(58) Field of Classification Search
USPC .......................... 438/710, 719, 723, 743, 757
See application file for complete search history.

(56) References Cited

U.S. PATENT DOCUMENTS

| | | | |
|---|---|---|---|
| 2005/0118755 A1* | 6/2005 | Lin et al. | 438/197 |
| 2010/0221921 A1* | 9/2010 | Kwon et al. | 438/699 |
| 2011/0017586 A1* | 1/2011 | Nakamura et al. | 204/157.43 |
| 2011/0244398 A1* | 10/2011 | Huang et al. | 430/323 |

* cited by examiner

*Primary Examiner* — Binh X Tran

(57) ABSTRACT

A method for forming an opening in a semiconductor device is provided, including: providing a semiconductor substrate with a silicon oxide layer, a polysilicon layer and a silicon nitride layer sequentially formed thereover; patterning the silicon nitride layer, forming a first opening in the silicon nitride layer, wherein the first opening exposes a top surface of the polysilicon layer; performing a first etching process, using gasous etchants including hydrogen bromide (HBr), oxygen ($O_2$), and fluorocarbons (CxFy), forming a second opening in the polysilicon layer, wherein a sidewall of the polysilicon layer adjacent to the second opening is substantially perpendicular to a top surface of the silicon oxide layer, wherein x is between 1-5 and y is between 2-8; removing the silicon nitride layer; and performing a second etching process, forming a third opening in the silicon oxide layer exposed by the second opening.

11 Claims, 3 Drawing Sheets

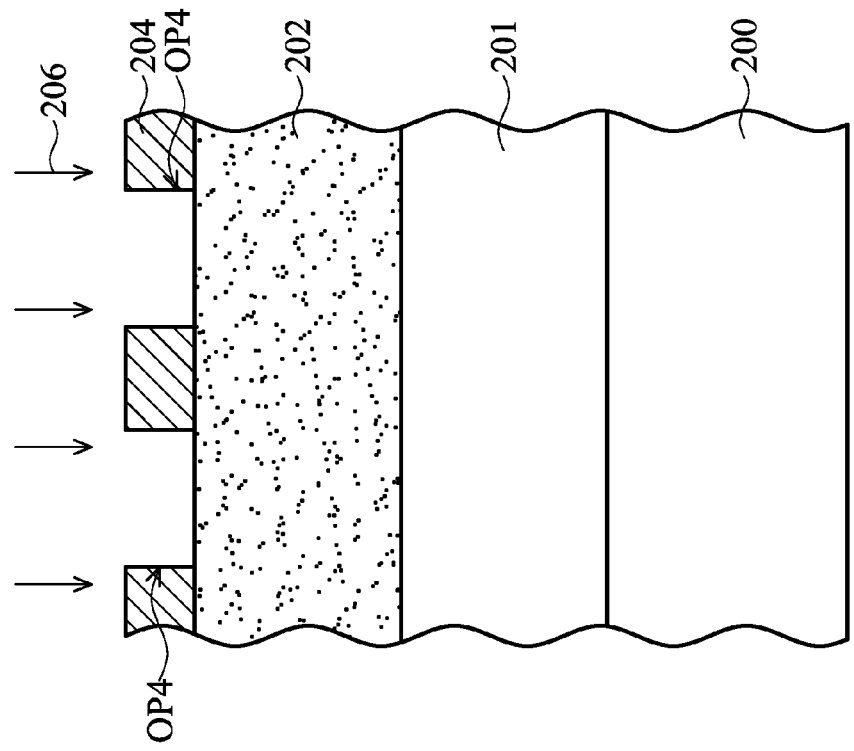
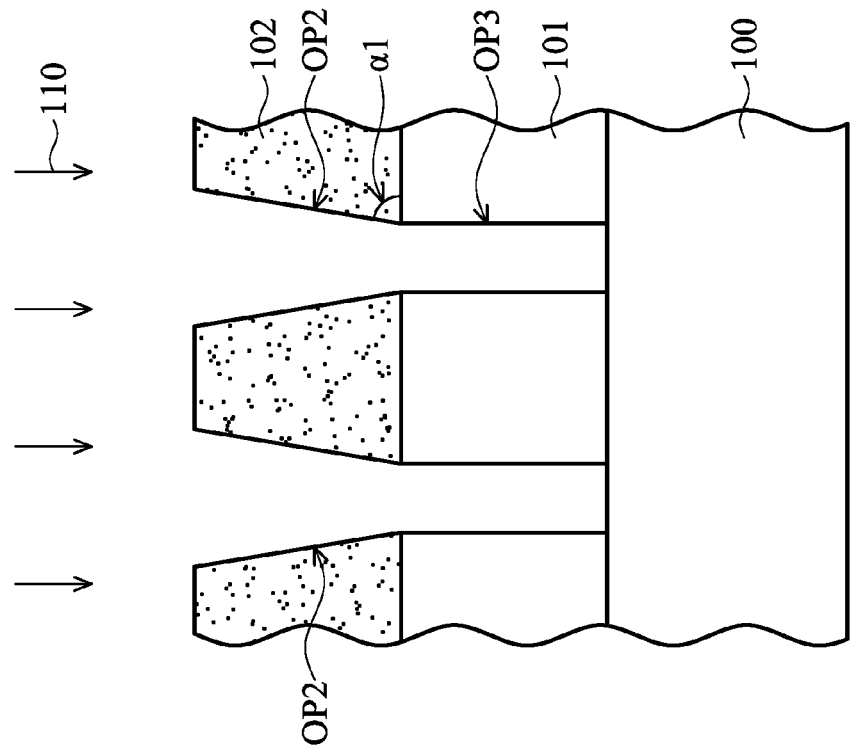
FIG. 3
FIG. 4

US 8,642,479 B2

METHOD FOR FORMING OPENINGS IN SEMICONDUCTOR DEVICE

BACKGROUND OF THE INVENTION

1. Field of the Invention

The present invention relates to semiconductor fabrication techniques, and in particularly to a method for forming an opening in a semiconductor device.

2. Description of the Related Art

With the rapid development of integrated circuit fabrication technologies, device miniaturization and integration is an important trend and topic in the electronics industry.

For the conventional method of forming an opening in a semiconductor device, a semiconductor substrate is provided and then a dielectric layer is formed over the semiconductor substrate. Thereafter, a photoresist layer is formed over the dielectric layer. After that, a conventional photolithographic process is used to define and form a patterned photoresist layer. Afterwards, using the patterned photoresist layer as an etching mask, an etching operation is carried out to remove a portion of the dielectric layer exposed by the patterned photoresist layer, thereby leaving a patterned dielectric layer with openings exposing a portion of a surface of the semiconductor substrate. The openings formed in the patterned dielectric layers may function as contact holes or contact vias, and conductive materials may sequentially fill the openings to form conductive contacts or vias therein.

In the aforementioned method of forming an opening in a semiconductor device, however, there are problems which need to be resolved. For example, the critical dimension (CD) of the opening formed in the photoresist layer being transferred to the opening formed in the dielectric layer may be inaccurate since a sloped sidewall profile of the opening is typically formed in the photoresist layer such that a critical dimension (CD) of the opening formed in the dielectric layer is different from the critical dimension (CD) of the opening formed in the photoresist layer. Ultimately, functionality of an element such as conductive contacts formed in the dielectric layer is affected and the reliability and yield of the semiconductor device comprising the same is also affected.

BRIEF SUMMARY OF THE INVENTION

An exemplary method for forming an opening in a semiconductor device comprises: providing a semiconductor substrate with a silicon oxide layer, a polysilicon layer and a silicon nitride layer sequentially formed thereover; patterning the silicon nitride layer, forming a first opening in the silicon nitride layer, wherein the first opening exposes a top surface of the polysilicon layer; performing a first etching process, using gasous etchants comprising hydrogen bromide (HBr), oxygen ($O_2$), and fluorocarbons ($C_xF_y$), forming a second opening in the polysilicon layer, wherein a sidewall of the polysilicon layer adjacent to the second opening is substantially perpendicular to a top surface of the silicon oxide layer, wherein x is between 1-5 and y is between 2-8; removing the silicon nitride layer; and performing a second etching process, forming a third opening in the silicon oxide layer exposed by the second opening.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 1-3 are cross sections of a method for forming an opening in a semiconductor device according to an embodiment of the invention; and FIGS. 4-6 are cross sections of a method for forming an opening in a semiconductor device according to another embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
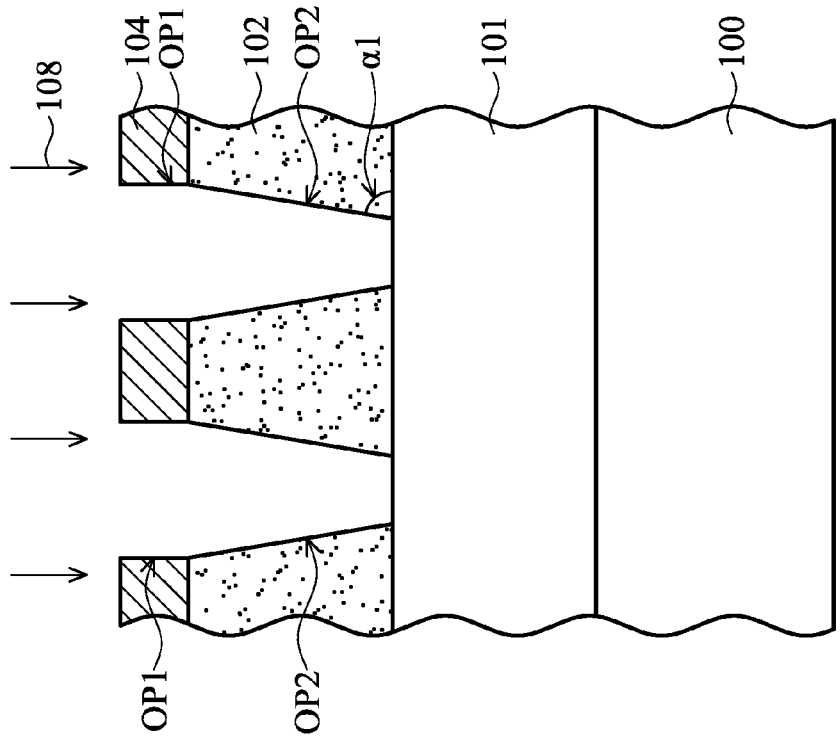
Figure 1:
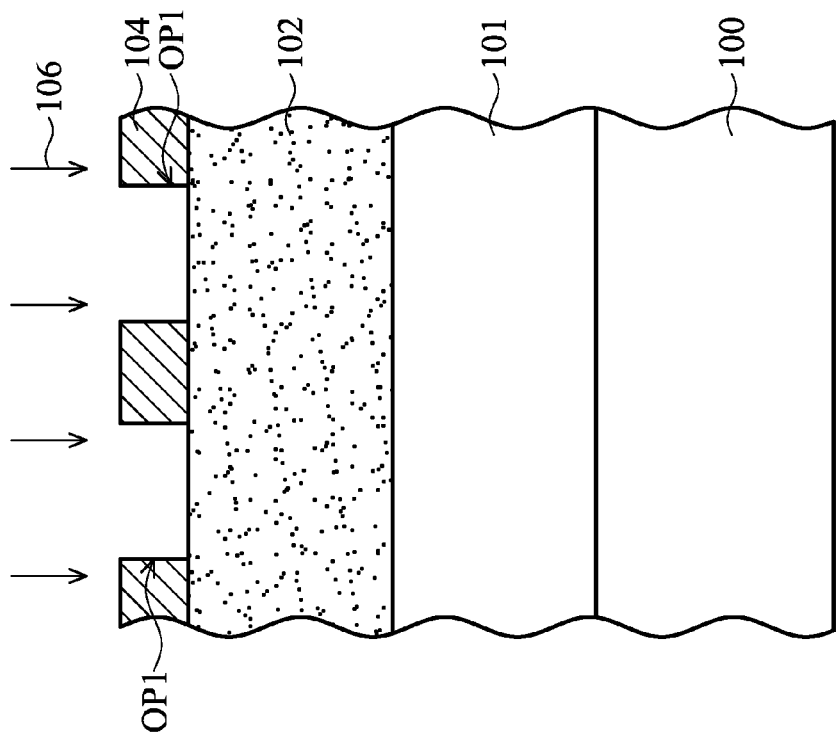

FIGS. 1-3 are cross sections showing an exemplary method for forming openings in a semiconductor device. Herein, the exemplary method is a method known by the inventors and is used as a comparative example to comment on the problems found by the inventors, but is not used to restrict the scope of the invention.

In FIG. 1, a semiconductor substrate 100 with a first dielectric layer 101, a second dielectric layer 102, and a third dielectric layer 104 sequentially formed thereover is first provided. The semiconductor substrate 100 can be, for example, a silicon substrate, and the first dielectric layer 101 can be, for example, a silicon oxide layer, having a thickness of about 1000-30000 Å, and the second dielectric layer 102 can be, for example, a polysilicon layer, having a thickness of about 500-5000 Å, and the third dielectric layer 104 can be, for example, a silicon nitride layer, having a thickness of about 500-2000 Å. Next, a patterned photoresist layer (not shown) with a plurality of openings (not shown) formed therein is formed over the third dielectric layer 104. An etching process (not shown) is then performed to etch portions of the third dielectric layer 104 exposed by the openings using the patterned photoresist layer as an etching mask, thereby forming a plurality of openings OP1 in the third dielectric layer 104. The openings OP1 may have an aspect ratio of about 3:1 to 1:1. The patterned photoresist layer is next removed to form a structure as shown in FIG. 1. As shown in FIG. 1, each of the openings OP1 partially exposes a portion of the second dielectric layer 102. Next, an etching process 106 is performed to etch the portion of the second dielectric layer 102 exposed by the openings OP1. In one embodiment, the etching process 106 can be a dry etching process such as a plasma etching process and may use gaseous etchants such as hydrogen bromide (HBr) and oxygen ($O_2$). In another embodiment, the hydrogen bromide (HBr) and oxygen ($O_2$) are provided in a ratio of about 50:0 to 200:15 during the etching process 106.

In FIG. 2, after the etching process 106, a portion of the second dielectric layer 102 exposed by the openings OP1 is etched and removed, and a plurality of openings OP2 are thus formed in the second dielectric layer 102. As shown in FIG. 2, the openings OP2 may have an aspect ratio of about 5:1 to 1:1 and are formed with a tapered profile which have a critical dimension (CD) reduced from a top portion to a bottom portion thereof. A sidewall of the second dielectric layer 102 adjacent to the openings OP2 and a top surface of the first dielectric layer 101 thus have an included angle α1 of about 80°-90° therebetween, and the critical dimension of the top portion of the openings OP2 is greater than a critical dimension of the bottom portion of the openings OP2. The openings OP2 formed in the second dielectric layer 102 partially expose portions of the first dielectric layer 101. Next, an etching process 108 such as a wet etching process is performed, and the first dielectric layer 104 with openings OP1 therein is then removed in the etching process 108.

In FIG. 3, an etching process 110 such as a dry etching process is performed to etch the portion of the first dielectric layer 101 exposed by the openings OP2, using the second dielectric layer 102 as an etching mask, thereby etching through portions of the first dielectric layer 101 and a plurality of openings OP3 are thus formed in the first dielectric layer 101. The openings OP3 formed in the first dielectric layer 101 may have an aspect ratio of about 30:1 to 1:1 and can be used as contact holes or contact vias which are often used in a semiconductor device. As shown in FIG. 3, the formed openings OP3 are formed with a reduced critical dimension which is the same as that of the bottom portion of the openings OP2 formed in the second dielectric layer 102 and not a designed critical dimension which is the same as that of the top portion of the openings OP2.

In the exemplary method as disclosed in FIGS. 1-3, since the critical dimension of the openings OP2 varies from a top portion to a bottom portion thereof, the critical dimension of the openings OP3 formed in the first dielectric layer 101 is somehow reduced such that the critical dimension of the openings OP3 cannot meet design target. Thus, openings with designed critical dimensions cannot be formed in the first dielectric layer 101 and functionality of elements such as conductive contacts (not shown) sequentially formed in the openings OP3 in the first dielectric layer 101 will be affected and the reliability and yield of the semiconductor device comprising the same will also be affected.

Figure 5:
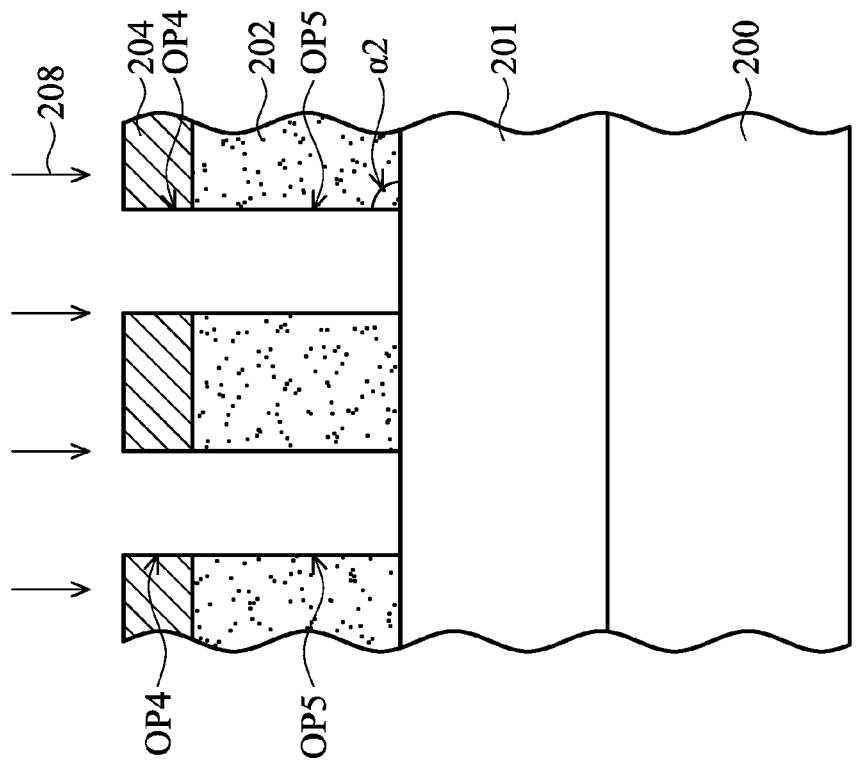
Figure 6:
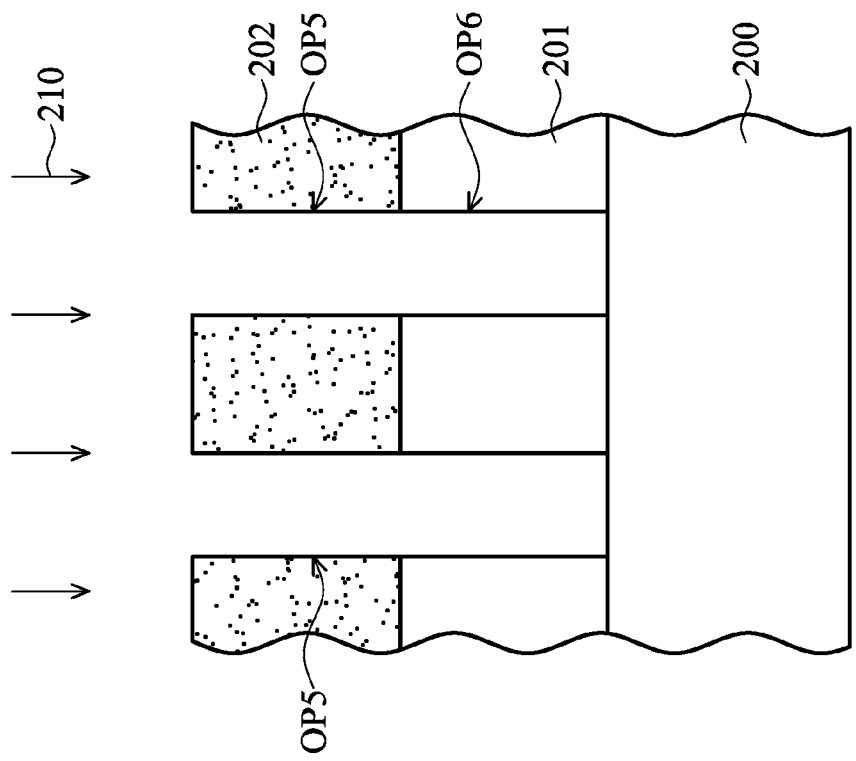

FIGS. 4-6 are cross sections showing an exemplary method for forming openings in a semiconductor device with accurate critical dimensions transferring of the openings in different dielectric layers.

In FIG. 4, a semiconductor substrate 200 with a first dielectric layer 201, a second dielectric layer 202, and a third dielectric layer 204 sequentially formed thereover is first provided. The semiconductor substrate 200 can be, for example, a silicon substrate, and the first dielectric layer 201 can be, for example, a silicon oxide layer, having a thickness of about 1000-30000 Å, and the second dielectric layer 202 can be, for example, a polysilicon layer, having a thickness of about 500-5000 Å, and the third dielectric layer 204 can be, for example, a silicon nitride layer, having a thickness of about 500-2000 Å. Next, a patterned photoresist layer (not shown) with a plurality of openings (not shown) formed therein is formed over the third dielectric layer 204. An etching process (not shown) is then performed to etch portions of the third dielectric layer 204 exposed by the openings using the patterned photoresist layer as an etching mask, thereby forming a plurality of openings OP4 in the third dielectric layer 204. The openings OP4 may have an aspect ratio of about 3:1 to 1:1. The patterned photoresist layer is next removed to form a structure as shown in FIG. 4. As shown in FIG. 4, each of the openings OP4 partially exposes a portion of the second dielectric layer 202. Next, an etching process 206 is performed to etch the portion of the second dielectric layer 202 exposed by the openings OP4. In one embodiment, the etching process 206 can be a dry etching process such as a plasma etching process and may use gaseous etchants such as hydrogen bromide (HBr), oxygen ($O_2$), and fluorocarbons (CxFy). In one embodiment, the x can be about 1-5 and the y can be about 2-8 in the fluorocarbons, and the fluorocarbons may comprises $CF_4$, $C_4F_8$, $CHF_3$ or $C_2F_6$. In another embodiment, the hydrogen bromide (HBr), oxygen ($O_2$), and fluorocarbons (CxFy) are provided in a ratio of about 50:0:0 to 200:20:50 during the etching process 206, and a flow rate of fluorocarbons (CxFy) can be, for example, about 0-50 sccm.

In FIG. 5, after the etching process 206, a portion of the second dielectric layer 202 exposed by the openings OP4 is etched and removed, and a plurality of openings OP5 are thus formed in the second dielectric layer 202. As shown in FIG. 5, the openings OP5 may have an aspect ratio of about 5:1 to 1:1 and are formed with a vertical profile which has a uniform critical dimension (CD) from a top portion to a bottom portion thereof. A sidewall of the second dielectric layer 202 adjacent to the openings OP5 and a top surface of the first dielectric layer 201 thus have an included angle α2 of about 88°-90°, and the critical dimension of the top portion of the openings OP5 is almost the same as a critical dimension of the bottom portion of the openings OP5. The openings OP5 formed in the second dielectric layer 202 partially expose portions of the first dielectric layer 201. Next, an etching process 208 such as a wet etching process is performed, and the third dielectric layer 204 with openings OP4 therein is then removed in the etching process 208.

In FIG. 6, an etching process 210 such as a dry etching process is performed to etch the portion of the first dielectric) layer 201 exposed by the openings OP5, using the second dielectric layer 202 as an etching mask, thereby etching through portions of the first dielectric layer 201 and a plurality of openings OP6 are thus formed in the first dielectric layer 201. The openings OP6 formed in the first dielectric layer 201 may have an aspect ratio of about 30:1 to 1:1 and can be used as contact holes or contact vias which are often used in a semiconductor device. As shown in FIG. 6, the formed openings OP6 are formed with a critical dimension which is the same as that of the openings OP5 formed in the second dielectric layer 202, which may meet a designed critical dimension.

In the exemplary method as disclosed in FIGS. 4-6, since the critical dimension of the openings OP5 are uniform from a top portion to a bottom portion thereof, the critical dimension of the openings OP6 formed in the first dielectric layer 201 is not reduced such that it meets design critical dimension. Thus, openings with designed critical dimensions can be formed in the first dielectric layer 201 and functionality of elements such as conductive contacts (not shown) sequentially formed in the openings OP6 in the first dielectric layer 201 can be ensured such that the reliability and yield of a semiconductor device comprising the same can also be ensured.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an opening in a semiconductor device, comprising:

providing a semiconductor substrate with a silicon oxide layer, a polysilicon layer and a silicon nitride layer sequentially formed thereover;

patterning the silicon nitride layer, forming a first opening in the silicon nitride layer, wherein the first opening exposes a top surface of the polysilicon layer;

performing a first etching process, using gaseous etchants comprising hydrogen bromide (HBr), oxygen ($O_2$), and fluorocarbons (CxFy), forming a second opening in the polysilicon layer, wherein a sidewall of the polysilicon layer adjacent to the second opening is substantially perpendicular to a top surface of the silicon oxide layer, wherein x is between 1-5 and y is between 2-8;

performing a second etching process to remove the silicon nitride layer; and performing a third etching process, forming a third opening in the silicon oxide layer exposed by the second opening.

2. The method as claimed in claim 1, wherein the first etching process is a dry etching process.

3. The method as claimed in claim 1, wherein the second opening is formed with a uniform critical dimension from a top to a bottom thereof, and the third opening has a critical dimension similar with that of the uniform critical dimension of the second opening.

4. The method as claimed in claim 1, wherein the CxFy used in the first etching process comprises $CF_4$, $CHF_3$, $C_4F_8$ or $C_2F_6$.

5. The method as claimed in claim 1, wherein the CxFy in the first etching process is provided with a flow rate of about 0-50 sccm.

6. The method as claimed in claim 1, wherein the hydrogen bromide, the oxygen ($O_2$), and the fluorocarbons are provided in a flow rate ratio of about 50:0:0 to 200:20:50 in the first etching process.

7. The method as claimed in claim 1, wherein the semiconductor substrate is a silicon substrate.

8. The method as claimed in claim 1, wherein the sidewall of the polysilicon layer adjacent to the second opening and a top surface of the silicon oxide layer has an inclined angle of about 88°-90° therebetween.

9. The method as claimed in claim 1, wherein the step of patterning the silicon nitride layer comprises:

forming a patterned photoresist comprising a plurality of openings over the silicon nitride layer;

etching the silicon nitride layer using the patterned photoresist as a mask to expose the top surface of the polysilicon layer.

10. The method as claimed in claim 1, wherein the third etching process is a dry etching process.

11. The method as claimed in claim 10, wherein the second etching process is a wet etching process.

* * * * *